(12) United States Patent
Kikugawa

(10) Patent No.: US 9,070,412 B2
(45) Date of Patent: Jun. 30, 2015

(54) CHANNEL BITWORD PROCESSOR, PRML DECODER, AND OPTICAL INFORMATION RECORDING/REPRODUCING DEVICE

(71) Applicants: Hitachi Consumer Electronics Co., Ltd., Kanagawa (JP); Hitachi-LG Data Storage, Inc., Tokyo (JP)

(72) Inventor: Atsushi Kikugawa, Tokyo (JP)

(73) Assignees: HITACHI-LG DATA STORAGE, INC., Tokyo (JP); HITACHI CONSUMER ELECTRONICS CO., LTD., Kanagawa (JP)

( * ) Notice: Subject to any disclaimer, the term of this patent is extended or adjusted under 35 U.S.C. 154(b) by 0 days.

(21) Appl. No.: 14/453,643

(22) Filed: Aug. 7, 2014

(65) Prior Publication Data

US 2015/0043321 A1 Feb. 12, 2015

(30) Foreign Application Priority Data

Aug. 8, 2013 (JP) ................................. 2013-165451

(51) Int. Cl.
*G11B 20/00* (2006.01)
*G11B 20/14* (2006.01)
*H03M 7/46* (2006.01)
*G11B 20/18* (2006.01)
*H03M 13/00* (2006.01)

(52) U.S. Cl.
CPC ............. *G11B 20/1403* (2013.01); *H03M 7/46* (2013.01); *G11B 20/1833* (2013.01); *H03M 13/00* (2013.01)

(58) Field of Classification Search
None
See application file for complete search history.

(56) References Cited

U.S. PATENT DOCUMENTS 5,781,131 A * 7/1998 Shimpuku et al. .............. 341/58

OTHER PUBLICATIONS

Kees A. Schouhamer Immink, A Practical Method for Approaching the Channel Capacity of Constrained Channels, IEEE Transactions on Information Theory, Sep. 1997, pp. 1389-1399, vol. 43, No. 5.

* cited by examiner

*Primary Examiner* — Wayne Young
*Assistant Examiner* — Brian Butcher
(74) *Attorney, Agent, or Firm* — Baker Botts L.L.P.

(57) ABSTRACT

It is an objective of the present invention to provide a technique, when using fixed-length run-length limit codes based on enumeration, that generates fixed-length channel bit words satisfying maximum run-length limitation using a simple configuration. A channel bit word processor according to the present invention includes an avoidance list that describes a difference between a user bit word satisfying a maximum run-length limitation of run-length limit code and a user bit word not satisfying the maximum run-length limitation. The channel bit word processor, if a user bit word does not satisfy the maximum run-length limitation, generates a channel bit word using a user bit word after the difference is added.

6 Claims, 12 Drawing Sheets

Fig. 2

| u | invalid | u' | diff | (u, diff) |
|---|---|---|---|---|
| 0 | | 0 | 0 | (0,0) |
| 1 | | 1 | 0 | |
| 2 | | 2 | 0 | |
| 3 | | 3 | 0 | |
| 4 | | 4 | 0 | |
| 5 | ✓ | 8 | 3 | (5,3) |
| 6 | ✓ | 9 | 3 | |
| 7 | ✓ | 10 | 3 | |
| 8 | | 11 | 3 | |
| 9 | | 12 | 3 | |
| 10 | | 15 | 5 | (10,5) |
| 11 | | 16 | 5 | |
| 12 | | 18 | 6 | (12,6) |
| 13 | ✓ | 19 | 6 | |
| 14 | ✓ | 20 | 6 | |
| 15 | | 21 | 6 | |
| 16 | | 22 | 6 | |
| 17 | ✓ | 23 | 6 | |
| 18 | | 24 | 6 | |
| 19 | | 25 | 6 | |

35 (indicates rightmost column)

CHANNEL BITWORD PROCESSOR, PRML DECODER, AND OPTICAL INFORMATION RECORDING/REPRODUCING DEVICE

CLAIM OF PRIORITY

The present application claims priority from Japanese patent application JP 2013-165451 filed on Aug. 8, 2013, the content of which is hereby incorporated by reference into this application.

BACKGROUND

1. Technical Field

The present invention relates to a technique for recording information using light.

2. Background Art

Parts of technical terms in following descriptions are those used in Blu-ray Disc (BD). These terms are sometimes referred to as other words in systems other than BD. However, since those skilled in the art could readily understand such words, technical terms in BD system will be used below.

Storage capacities of optical discs have been expanded mainly by reducing wavelength of light sources, by increasing numerical apertures (NA) of objective lenses, and by increasing the number of recording layers per one disc. In dual layer BD systems, recording capacity of 50 GB have been achieved using blue semiconductor lasers and high NA objective lenses with NA of 0.85. However, reducing wavelengths of recording/reproducing light or increasing NA of objective lenses have almost reached their limits.

Under such circumstances, a possible method for further increasing recording capacity of optical discs may be to increase linear recording density by simply shrinking channel bit length, thereby increasing surface recording density. By increasing the number of recording layers up to 3-4 layers in addition to above, BDXL with recording capacity of more than 100 GB has been achieved. However, this method intensifies inter symbol interferences, thus reducing resolution of short marks or spaces. In BDXL, resolution of the minimum marks and spaces is 0. By further shrinking channel bit length, resolution of the second minimum marks and spaces will be 0. Those skilled in the art readily understand that decoding process of PRML method will not work under such configurations. In other words, this method has a limit in significantly improving recording density.

Another method for increasing recording capacity of optical discs is code modulation. A type of code modulation has already been used in BD or the like. It is expected that code modulation will achieve several advantageous effects. Improving linear recording density is one of the most expected effects among them. Run-length limit code is known as one of methods used for that objective.

In optical discs, spot diameter of light used for reproduction is much larger than physical resolution of recording medium. Therefore, if binary data to be recorded (referred to as user data in this document) is recorded in association with existence/non-existence of recording mark, the margin between recorded bits may be smaller than the diameter of light spot. This drastically makes it difficult to recognize codes due to inter symbol interferences between adjacent bits. As a result, the resolution of recording medium cannot be utilized efficiently.

On the other hand, in run-length limit code, user data is recorded after converting it into a code sequence described by length of marks and spaces. Even if the unit length of marks and spaces (channel bit length) is smaller than the light spot diameter, it is possible to identify the lengths of marks and spaces in the temporal axis during reproduction. Note that the minimum marks and spaces have a length longer than 2 channel bits so that they can be reproduced with sufficient resolutions. In this way, it is possible to achieve a higher linear recording density than that of optical systems having the same special resolution.

When recording information using run-length limit codes, it is principally appropriate to discuss lengths of both recorded marks and spaces. However, for the sake of simplifying descriptions, only marks will be discussed when handling recorded marks and spaces in the same way as long as no confusion will be incurred. For example, "resolution of the minimum mark" means "resolution of the minimum mark and space".

Two types of run-length codes are known. The first one is fixed length code on the basis of enumeration. The second one is variable length code. The run-length limit code used in BD, which is a current representative optical disc, is a variable length code with a minimum run length of 1. It achieves a linear recording density that is four-thirds times larger than that of without code modulation.

Non-Patent Document 1 listed below describes an algorithm to generate, while satisfying the minimum run-length limitation, fixed-length channel bit words corresponding to user bit words. Since those skilled in the art will readily understand the algorithm, its details will not be described in this document. With this algorithm, it is possible to mathematically calculate fixed-length channel bit words from given fixed-length user bit words (channel bit word generation). Similarly, from channel bit words, it is possible to calculate corresponding user data words using simple mathematic calculations (channel bit word demodulation).

RELATED ART DOCUMENTS

Non-Patent Documents

Non-Patent Document 1: IEEE TRANSACTIONS ON INFORMATION THEORY, VOL. 43, NO. 5, SEPTEMBER 1997

SUMMARY

The method described in Non-Patent Document 1 generates fixed-length channel bit words satisfying the minimum run-length limitation. However, it is difficult to generate fixed-length channel bit words satisfying the maximum run-length limitation.

The present invention is made in the light of the above-mentioned technical problem. It is an objective of the present invention to provide a technique, when using fixed-length run-length limit codes based on enumeration, that generates fixed-length channel bit words satisfying maximum run-length limitation using a simple configuration.

A channel bit word processor according to the present invention includes an avoidance list that describes a difference between a user bit word satisfying a maximum run-length limitation of run-length limit code and a user bit word not satisfying the maximum run-length limitation. The channel bit word processor, if a user bit word does not satisfy the maximum run-length limitation, generates a channel bit word using a user bit word in which the difference is added.

With the channel bit word processor according to the present invention, it is possible to generate fixed-length channel bit words satisfying maximum run-length limitation using simple configurations.

BRIEF DESCRIPTION OF THE DRAWINGS

FIG. 2 is a diagram showing a configuration and a data example of an avoidance list 35.

DETAILED DESCRIPTION OF THE EMBODIMENTS

<Embodiment 1>

In an embodiment 1 of the present invention, a channel bit word processor will be described that generates fixed-length channel bit words satisfying a maximum run-length limitation when fixed-length run-length limit codes based on enumeration are used. Firstly, a basic concept of the embodiment 1 will be described. Then a specific configuration of a channel bit word processor 30 according to the embodiment 1 will be described.

It is assumed that elements of a user bit word set are $u(i)$ ($i=0, 1, 2, \ldots, 2^n-1$: user bit word number). It is further assumed that elements of a channel bit word calculated by the method described in Non-Patent Document 1 are $c(i)$. If $c(p)$ is a bit pattern that does not satisfy the maximum run-length limitation, it is necessary to additionally select a bit pattern corresponding to $u(p)$.

For the sake of simplification, a case is assumed where there is only one bit pattern $c(p)$ corresponding to above. In this case, it is possible to generate a channel bit pattern corresponding to $u(p)$ while satisfying the maximum run-length limitation, by newly assigning an element $c(p+s)$ (s: natural number) of a channel bit word set that satisfies the maximum run-length limitation and which rank is higher than that of $c(p)$ (refer to Non-Patent Document 1 regarding the definition of rank).

Even if there is a second one of bit pattern $u(q)$ ($q>p$) that does not satisfy the maximum run-length limitation, a method similar to above may be used. Namely, it is possible to generate a channel bit pattern corresponding to $u(q)$ while satisfying the maximum run-length limitation by assigning, to a user bit word element $c(q)$, $u(q+t)$ that satisfies the maximum run-length limitation and which rank is larger than that of $u(q+s)$. The s and t above are referred to as word number offsets. If there exists three or more of channel bit patterns that do not satisfy the maximum run-length limitation, they can be handled similarly. In addition, similar methods can be applied to channel bit patterns that are to be avoided for reasons other than run-length limitation violations such as consecutive minimum run-length patterns. In practical bit patterns, if there exists $c(p)$ that violates the maximum run-length limitation, peripheral elements such as $c(p+1)$, $c(p+2)$, ... also tend to violate the maximum run-length limitation.

Figure 1:
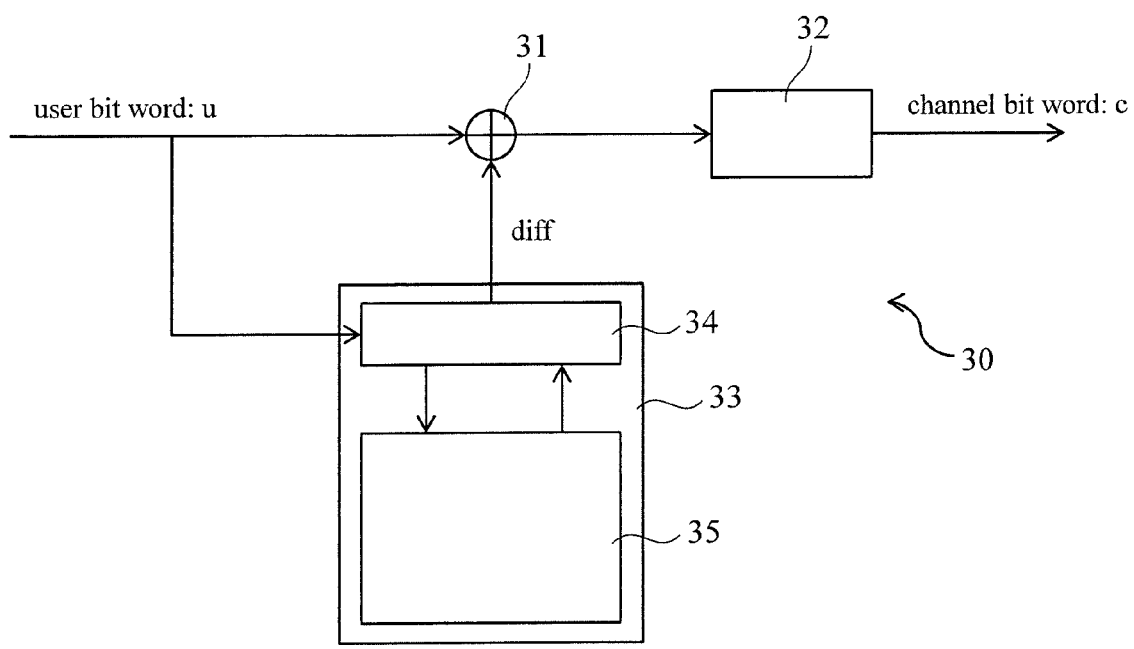
FIG. 1 is a block diagram of a channel bit word processor 30 according to an embodiment 1.

FIG. 1 is a block diagram of a channel bit word processor 30 according to the embodiment 1. The channel bit word processor 30 implements the technical concept above. The channel bit word processor 30 comprises an adder 31, a channel bit word generator 32, and an offset calculator 33. The offset calculator further includes a searcher 34 and an avoidance list 35. Details of those components will be described later.

FIG. 2 is a diagram showing a configuration and a data example of the avoidance list 35. In order to facilitate understanding, other data related to the avoidance list 35 is described along with it. Each column is, from the leftmost column: user bit word number of a user bit word u; invalid flag that indicates whether the run-length limitation of u is violated (if this column is checked, u violates the limitation); a value calculated by adding a word number offset diff is added to the user bit word number of u; the word number offset diff; a value registered into the avoidance list 35. In order to distinguish between before and after adding the word number offset diff, the user bit word number before adding is described as u, and the user bit word number after adding is described as u'. The data examples in FIG. 2 are sorted in ascending order of u. The data in FIG. 2 is shown only for explanation and it does not show the practical run-length limitation codes themselves.

Next, a procedure for generating the avoidance list 35 will be described. Candidates of channel bit word are generated using enumeration with u increased from 0 one-by-one. Then it is checked whether the run-length limitation is satisfied considering the combination with connection words. The invalid column is checked for each u that does not satisfy the run-length limitation. The candidates of channel bit word are continuously generated until the run-length limitation is satisfied with the word number offset being increased.

In the example of FIG. 2, u=0-4 satisfy the run-length limitation. Since u=5-7 violate the run-length limitation, the invalid column is checked. When u=8 has been reached, the run-length limitation has been satisfied. Thus u'=5-7 are skipped and thus u'=8 is next to u'=4. The word number offset diff=3 at that time. Similarly, u'=13-14 and u'=17 are skipped. As the number of skipped u' is accumulated, the word number offset diff is increased.

In the above-mentioned process, when the number of skipped u' is increased, the word number offset diff changes. The combination of (u, diff) at that time is registered into the avoidance list 35. Using the combination of (u, diff), it is possible to specify the u to which the same word number offset diff is to be applied. The procedure thereof will be described below.

The offset calculator 33 receives a user bit word u. The searcher 34 searches the avoidance list 35 using the u as a search key. The searcher 34 searches an element in which p≤i among the elements (p, diff) in the avoidance list 35. If the searcher 34 founds such an element, the searcher 34 sends its word number offset diff to the adder 31. If no such element is found, the searcher 34 sends 0. The adder 31 sends, to the channel bit word generator 32, a value (=u') calculated by adding the u and the diff. The channel bit word generator 32 generates a channel bit word (Non Return to Zero: NRZ format) using the received u' according to an enumeration algorithm.

Figure 3:
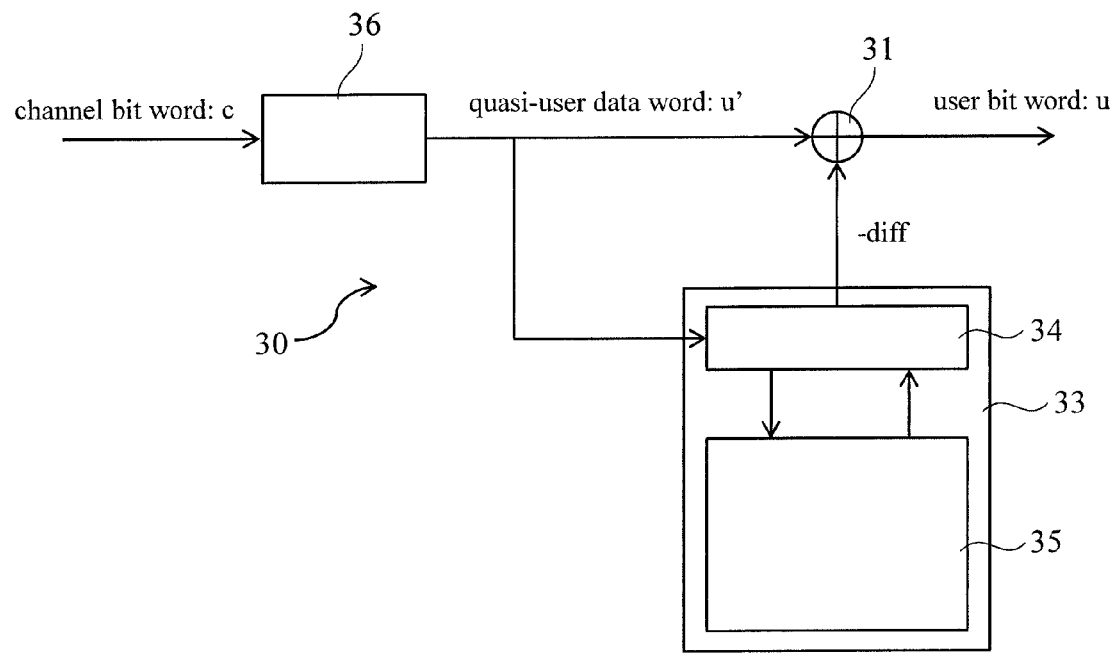
FIG. 3 is a block diagram showing a process in which the channel bit word processor 30 demodulates a user bit word u from a channel bit word c.

FIG. 3 is a block diagram showing a process in which the channel bit word processor 30 demodulates a user bit word u from a channel bit word c. For the sake of convenience, the channel bit word generator 32 is omitted. The blocks shown in FIGS. 2 and 3 may be configured integrally or may be configured separately into a channel bit word generator and a user bit word demodulator.

The channel bit word processor 30 converts the channel bit sequence decoded from the reproduction signal from NRZI (Non Return to Zero Inverted) format into NRZ format, and removes connection words with reference to the flame sync units to separate the sequence into channel bit word c. The channel bit word demodulator 36 converts the channel bit word c into a quasi-user bit word u' using a reverse conversion of enumeration. Since those skilled in the art could readily understand this process with reference to Non-Patent Document 1, details are omitted. As described in the method of FIGS. 1 and 2, the word number offset diff is added in the quasi-user data word u'. Thus it is necessary to subtract the offset diff. The searcher 34 searches an element (p, diff) of the avoidance list 35 corresponding to a minimum p+diff satisfying u'≥p+diff, reverses the sign, and outputs it to the adder 31. The adder 31 subtracts the word number offset diff (−diff) from the quasi-user data word u' to acquire a user data word u.

<Embodiment 1: Summary>

As discussed thus far, the channel bit word processor 30 according to the embodiment 1 comprises the avoidance list 35 that stores values specifying one or more user bit word u to which the same word number offset diff is to be applied, and generates channel bit words using the avoidance list 35. This enables generating channel bit words satisfying the maximum run-length limitation using a simple configuration.

In addition, the avoidance list 35 stores a combination of: one or more minimum word number of user bit word to which the same word number offset diff is to be applied; and a value of diff corresponding to the word number. Accordingly, it is not necessary to store the values of diff for all of user bit word u. Thus it is possible to limit the size of the avoidance list 35 within a very small range.

<Embodiment 2>

In the embodiment 1, a configuration example is described in which channel bit words satisfying the maximum run-length limitation are generated/demodulated when using fixed-length run length limit codes. In such fixed-length modulations, since the length of channel bit words is fixed, it is advantageous in that errors that occur around channel bit word boundaries are not likely to propagate. However, if patterns that are likely to cause burst errors exist around channel bit word boundaries, it is highly likely that the error propagates into adjacent channel words due to burst errors caused at the regions across the boundary.

Then in an embodiment 2 of the present invention, a configuration will be described that suppresses such error propagations. Firstly, specific examples of errors will be described. Then a configuration example for suppressing error propagations will be described.

Code modulation achieves several functions such as an effect of improving linear recording density, an effect of preventing excessive continuation of 0 or 1, and the like. In optical discs, it is the most important to improve, by limiting run-length in code modulation processes, linear recording density using code modulations without shrinking spot diameters. 1-7PP code with run-length of 1, which is used in BD, achieves a linear density that is four-third times larger than that of without code modulation.

A linear recording density improved ratio E using run-length limit code is expressed by Equation 1 below. d and C are the minimum run-length and the capacity, respectively.

$$E=(d+1)C \quad \text{(Equation 1)}$$

C is expressed by Equation 2 below.

$$C=\log_2 \lambda \quad \text{(Equation 2)}$$

λ is a maximum real root of the characteristic equation expressed by Equation 3 below. k is the maximum run-length.

$$z^{k+2}-z^{k+1}-z^{k-d+1}+1=0 \quad \text{(Equation 3)}$$

Figure 4:
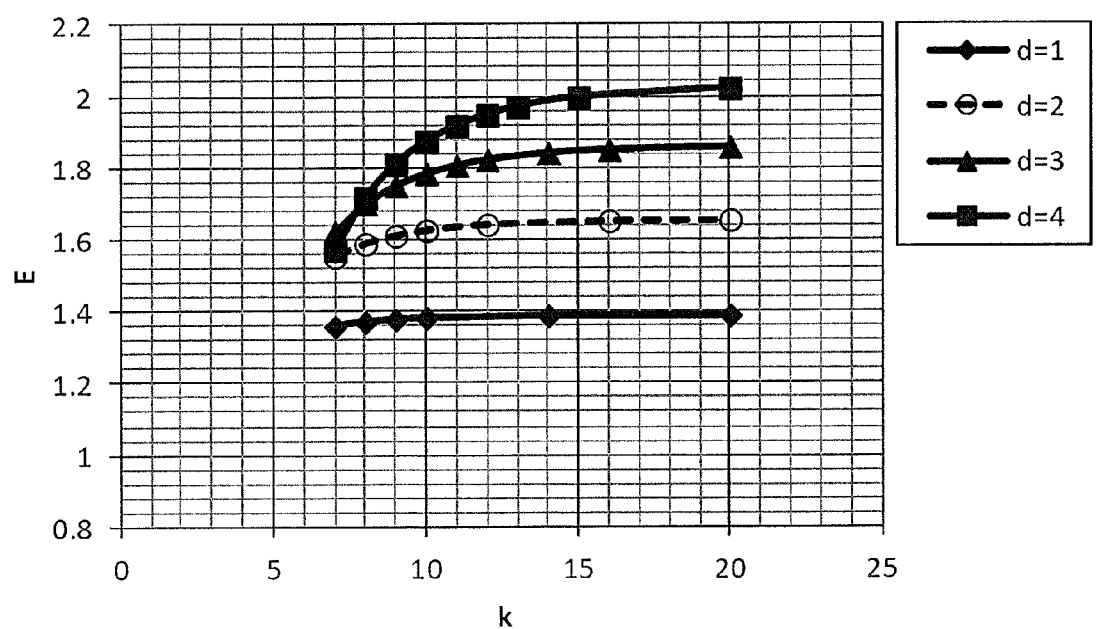
FIG. 4 is a graph showing maximum Es for each case where d=1, 2, 3, 4 respectively.

FIG. 4 is a graph showing a maximum Es for each case where d=1, 2, 3, 4 respectively. In the case of BD, E=4/3. Therefore, in order to achieve 400 GB/disc, it is necessary to make the linear recording density three-second times larger than that of BD. In other words, it is necessary to use combinations of (d, k) that is possible to achieve E≥2. According to the graph shown in FIG. 4, it is understood that it is necessary to use d=4. The value of E calculated by each of equations above is a theoretical value. In practically definable code modulations, its value is usually below the theoretical value.

Code modulation is a mapping in which mi bits of codes in a code sequence set A are associated with ni bits of codes in a code sequence set B on the one-by-one basis (m, n, i are natural numbers). Variable length code and fixed length code using enumeration are known as practical code modulations.

As described in Non-Patent Document 1, fixed length code modulation couples, via short connection words, channel bit words of fixed-length satisfying the run-length limitation selected according to user data. Each bit value in the connection words is selected so that channel bit words before and after the each bit value and the each bit value itself satisfy the run-length limitation.

Assuming that the length of the connection word is a, the effective linear recording density improved ratio E* of fixed-length code modulation is given by Equation 4 below.

$$E^*=\{(d+1)m\}/\{n+a\} \quad \text{(Equation 4)}$$

In partial response systems, the smaller magnitude of patterns is, the more it is likely to cause errors. Accordingly, if conventionally developed modulation codes are used, some measure is taken in typical cases so that the appearance frequency of minimum length marks is restricted up to a certain number. In addition, in partial response systems, it is likely that patterns with smaller Euclidean distance differences are more easily misrecognized. However, in a system where 2T marks with 0 resolution appear, such as BDXL, multiple patterns in which misrecognition cannot be negligible because of including 2T marks exist, even if Euclidean distance differences are large. Similar phenomenon occurs when the minimum run length d is made larger and the minimum mark length is approximately shrunk to the minimum mark length of BDXL. Further, if the minimum run length d is large, the resolution difference between the minimum mark length and the second minimum mark length is small. Therefore, complicated long burst errors such as patterns including second shortest marks cause problems. Such burst errors incur following problems.

(A) In regions where short marks consecutively appear, an error may trigger burst errors with approximately the same length as that of the region. Thus the influence of the first error may be expanded.

(B) Since multiple edges simultaneously shift, channel bit patterns that are not included in the conversion table might appear causing demodulation errors.

Figure 5:
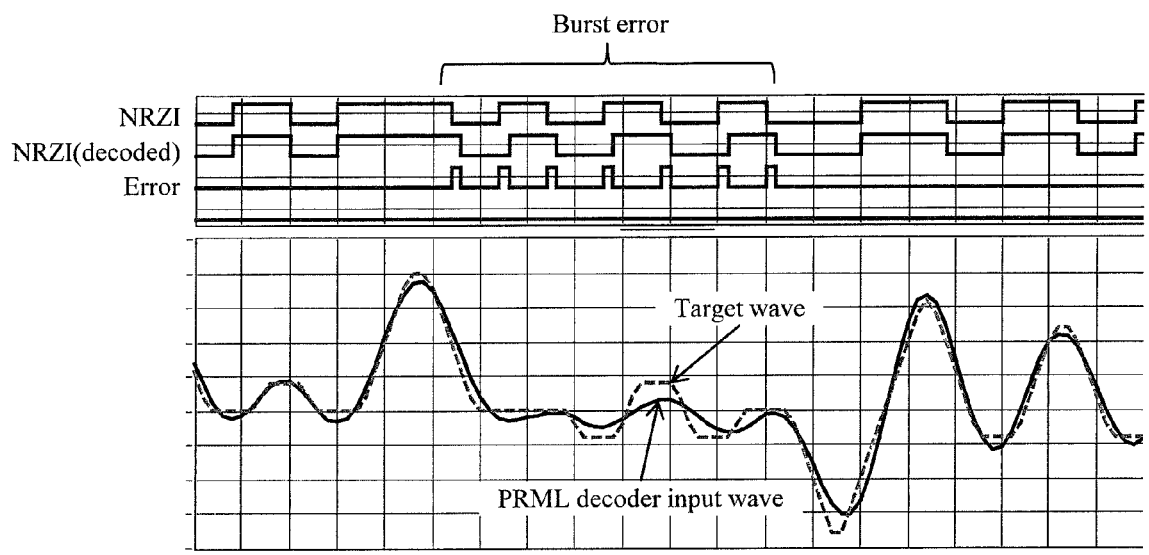
FIG. 5 shows an example of burst error observed in a reproduction simulation.

FIG. 5 shows an example of burst error observed in a reproduction simulation. Reproduction signals are calculated using convolution with respect to channel bit patterns based on optical responses calculated by optical simulations. In the channel bit patterns, (4, 21) PP code modulation described in "JP Patent Publication (Kokai) 2003-273743 A" is applied to random user bit word sequences. The calculation condition of optical responses is: spot light wavelength=405 nm; objective lens NA=0.85. The channel bit length is 22.3 nm. With such conditions, the minimum mark length is the same as the minimum mark length of BDXL. PR (1, 1, 1, 1, 1, 1, 1, 1, 1, 1, 1) ML is used for reproduction channels.

Figure 6:
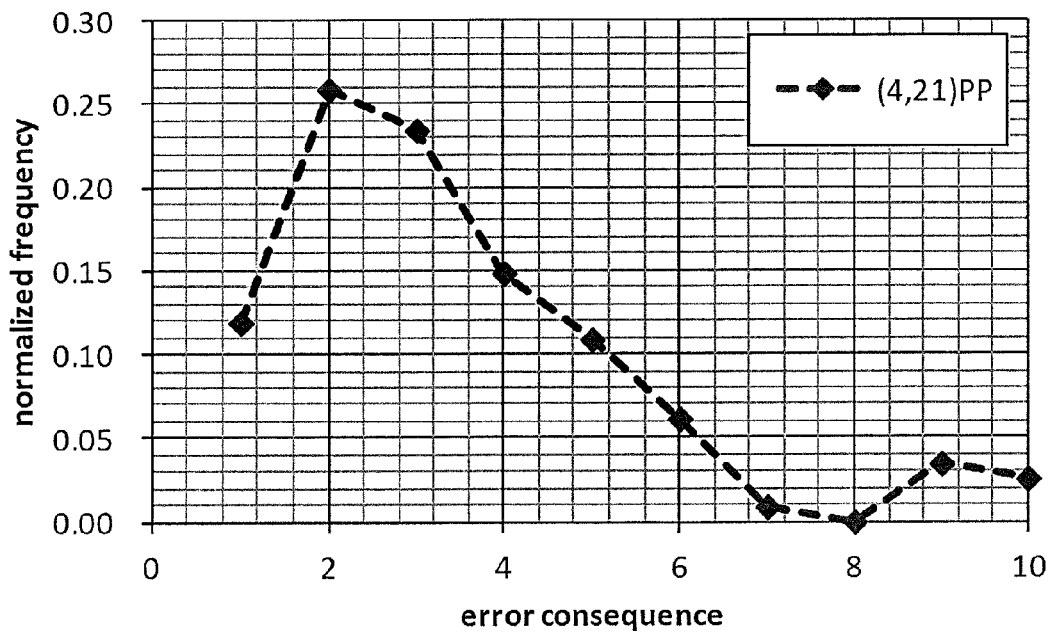
FIG. 6 is a graph showing an appearance frequency of edge numbers included in a burst error observed in a simulation using (4, 21) PP shown in FIG. 5.

FIG. 6 is a graph showing an appearance frequency of edge numbers included in burst errors observed in a simulation using (4, 21) PP shown in FIG. 5. The horizontal axis of the graph indicates the edge number included in the burst error and corresponds to the length of the burst error. In a case of single edge shift, its value is 1 and the shift of the minimum length mark is 2. As shown in FIG. 6, in (4, 21) PP, the ratio of single edge shift error is small and most of errors are burst errors. An error in which the number of consecutive error is 2 can be most frequently observed.

Figure 7:
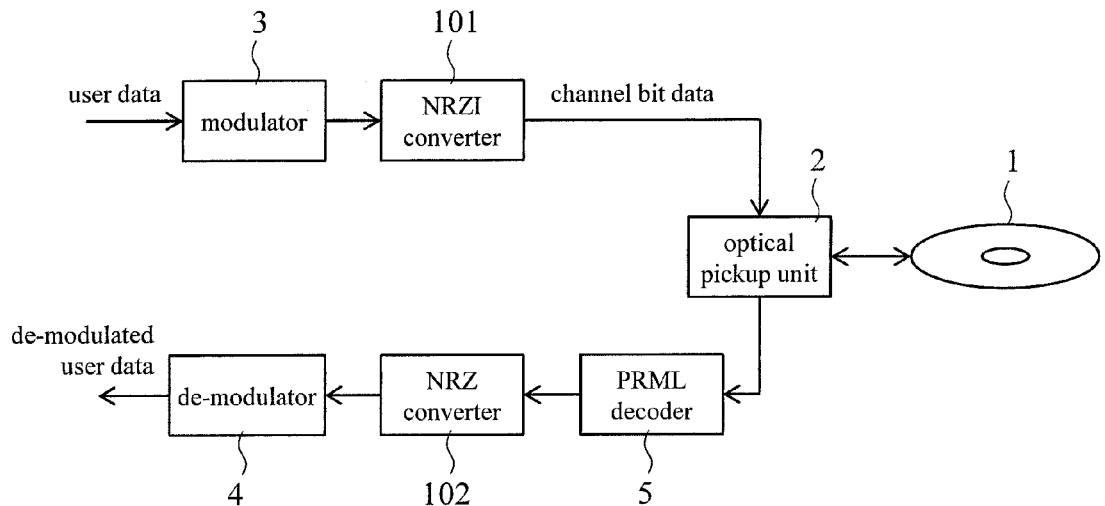
FIG. 7 is a diagram showing a recording/reproducing process of data.

FIG. 7 is a diagram showing a recording/reproducing process of data. The figure is simplified by extracting portions required in the explanation only. The modulator 3 performs code modulation to user data using a predetermined code modulation scheme. The output from the modulator 3 is bit sequence data of NRZ format. In bit sequence data of NRZ format, a bit corresponding to the mark boundary is expressed with "1", and other bits are expressed with "0". The NRZI converter 101 converts the output into NRZI format where "1" and "0" each corresponds to mark and space respectively. The optical pickup 2 records the signal into the optical disc 1.

When reproducing data, the optical pickup 2 optically reproduces the signal recorded in the optical disc 1 and converts it into electrical signals. Since the size of optical spot is finite, inter symbol interferences occur. The PRML decoder 5 decodes channel bit sequences from the reproduction signal while resolving the inter symbol interferences. The NRZ converter 102 converts the decoded channel bit sequences from NRZI format into NRZ format. The demodulator 4 demodulates the output from the NRZ converter 102 into binary data. If no error or time shift has occurred during the procedure above, the output from the demodulator 4 matches with the original user data.

Figure 8:
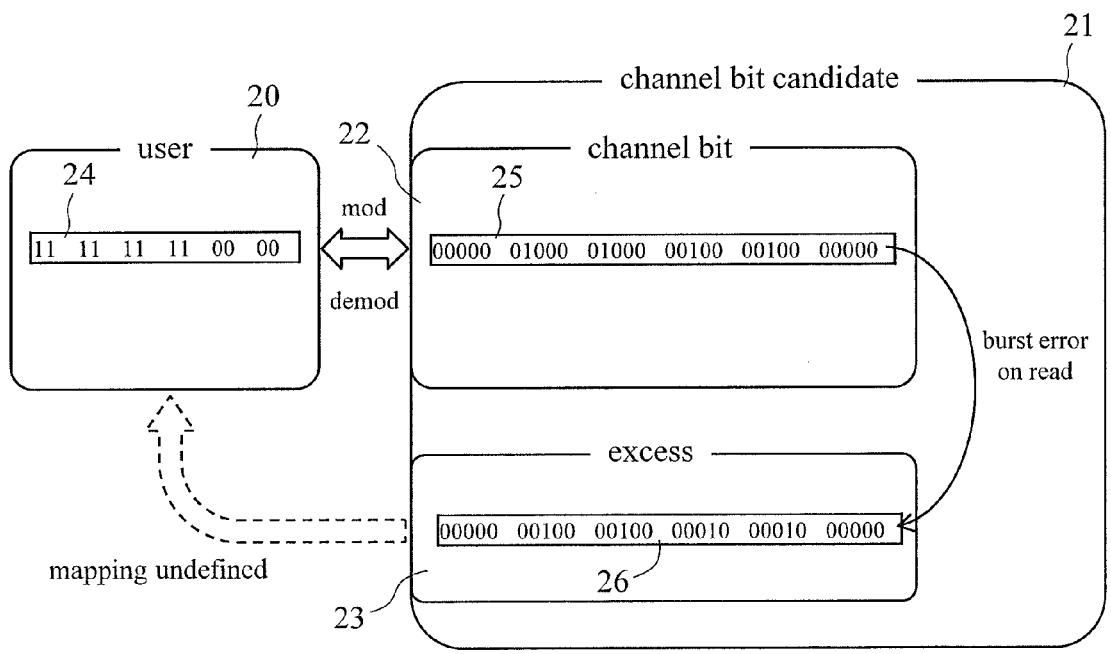
FIG. 8 is a diagram showing a process of code modulation and demodulation.

FIG. 8 is a diagram showing a process of code modulation and demodulation. When modulating, the user bit sequence 24 which is elements of the user bit sequence set 20 is converted into the corresponding channel bit sequence 25 in the channel bit sequence set 22 in accordance with a conversion table. The user bit sequence set and the channel bit sequence set are coupled by one to one mapping. In other words, demodulation is an inverse mapping of modulation. In order to establish such code modulation, it is necessary that the size of channel bit sequence candidate set is equal to or larger than that of user bit sequence set. Typically, the channel bit sequence candidate set is larger as shown in FIG. 8. Namely, there exists channel bit sequence candidates (hereinafter, redundant bit sequence 26) that are not included in the conversion table. The set which element is the redundant bit sequence 26 is referred to as a redundant bit sequence set 23. Accordingly, if an error occurs during the reproduction process as shown in the example of FIG. 8, it causes the bit sequence after reproduction may change into the redundant bit sequence 26. In such cases, since demodulation using the conversion table cannot be performed, exception handlings are required and thus the configuration of the demodulator becomes complicated. This applies to both of variable length code/fixed length code.

In many cases of burst errors, multiple edges simultaneously shift in the same direction. Thus in a case of variable length conversion, the recognition of channel word boundaries may not work. In variable length conversions, prefix pattern conditions are used in order to perform channel word boundary recognitions during demodulation. The prefix pattern condition is a condition where the beginning portion of channel bit patterns does not include channel bit patterns shorter than the condition.

However, if burst error occurs, a prefix pattern is recognized as another pattern. As a result, the boundary of channel words becomes different from that of without errors. This misrecognized boundary is referred to as false channel word boundary. A channel word separated by a false channel word boundary is referred to as false channel word. Obviously, the demodulated result is different from that of without errors. These results are referred to as false user bit sequence. The demodulation result with errors is problematic. More seriously, demodulation could be disabled because recognition of channel word boundaries fails and thus channel words that are not included in the conversion table appear. In such cases, exception handlings will be required. In addition, misrecognition of channel word boundaries propagates like a chain-reaction to cause demodulation errors in regions broader than those of burst errors during decode process. For the sake of convenience, such misrecognition of channel word boundaries is referred to as boundary error. In addition, the phenomenon where boundary errors propagate subsequently is referred to as boundary error propagation, and the phenomenon where demodulation process cannot be continued is referred to as demodulation error.

In a case of fixed length modulation, no boundary propagation occurs because the channel word length is fixed. However, if there exists patterns that are likely to cause burst errors around channel word boundaries, it is more likely that burst errors occur at the region across the channel word boundary and that the error propagates into adjacent channel words. In addition, in fixed length modulations, the values of m and n are increased as far as possible in order to relatively decrease the influence of connection word sequence and to improve E*. In other words, the channel word length is made longer. Therefore, the influence is significant especially when the error propagates across the channel word boundary.

Figure 9:
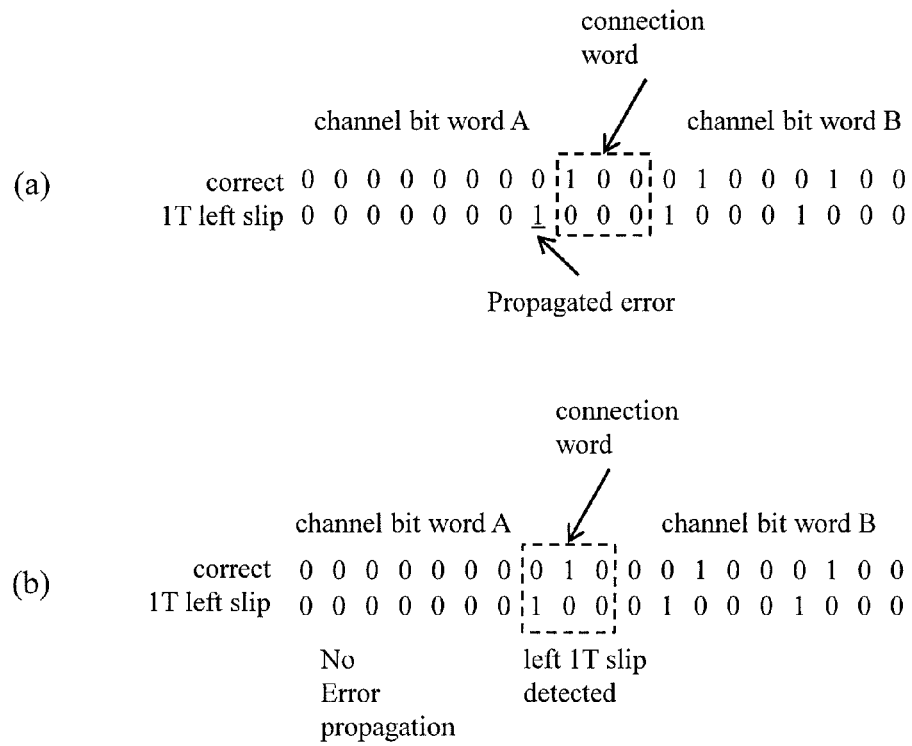
FIG. 9 shows a bit pattern example in which a pattern that is likely to incur burst errors exists around a channel word boundary.

FIG. 9 shows a bit pattern example in which a pattern that is likely to incur burst errors exists around a channel word boundary. FIG. 9(a) upper diagram shows a proper channel bit word sequence. FIG. 9(b) shows an example where an error propagates into an adjacent channel word due to a burst error in which the pattern of FIG. 9(a) slips leftward by 1T.

The bit sequence surrounded by the dotted line is connection words. In FIG. 9(a) lower diagram, a bit "1" in the connection word is pushed toward the channel word A (underlined bit "1") due to the burst error of leftward 1T slip caused in the channel word B. Accordingly, the decode result of the channel word A also results in error.

In the example shown in FIG. 9(a), the connection word is selected according to conventional techniques. In conventional techniques, connection words may be arbitrarily selected within a range satisfying the run-length limitation considering preceding and subsequent channel bit words. Therefore, if "1" exists at the end of connection words, error propagation is likely to occur.

FIG. 9(b) shows an example where a fixed bit sequence "010" is used as the connection word, which is different from conventional techniques. FIG. 9(b) upper diagram shows a bit pattern example in which patterns that are likely to cause burst errors exist around the channel word boundary. In FIG. 9(b) lower diagram, a bit "1" in the connection word is pushed leftward by 1T due to the burst error of leftward 1T slip caused in the channel word B. However, since the error is within the connection word, there is no influence in the decode result of the channel bit word A. In this way, it is possible to prevent errors from propagating into adjacent channel words by always using specific bit patterns as connection words. In the example above, it is possible to selectively use "010" or "000" as connection words.

Figure 10:
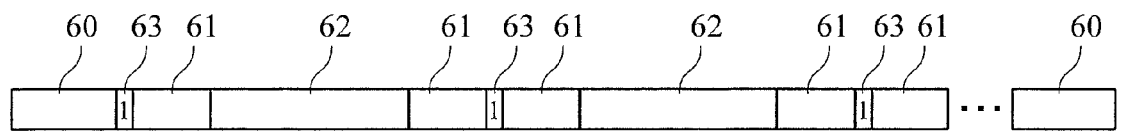
FIG. 10 shows a frame configuration example in which "1" is always used as a connection word.

FIG. 10 shows a frame configuration example in which "1" is always used as a connection word. The connection word with fixed "1" is referred to as a fixed edge 63. The range of one frame is from the frame sync unit 60 to immediately before the frame sync unit 60 of the next frame. The channel word 62 is generated from user data using the above-described method. Due to the minimum run-length limitation, there are at least d bits of consecutive "0" before and after the fixed edge. In other words, the pattern is fixed for 2d+1 time units. These d bits of consecutive "0" are referred to as zero unit 61.

If strong inter symbol interferences exist, it is effective to decode channel bits using PRML (Partial Response Maximum Likelihood) method. Assuming that known patterns appear at specific locations as mentioned above, it is possible to prevent error propagations into adjacent channel words as well as to improve decode performances around the position. Hereinafter, specific configurations of a decoder using PRML method will be described.

In order to improve decode performances using the frame configuration of FIG. 10, a special design is required in the PRML decoder. In other words, it is necessary to change the calculation method of branch metrics in the ACS (Add Compare Select) unit of the PRML decoder in synchronization with the timing when the fixed patterns appear. The process will be described using a trellis diagram.

Figure 11:
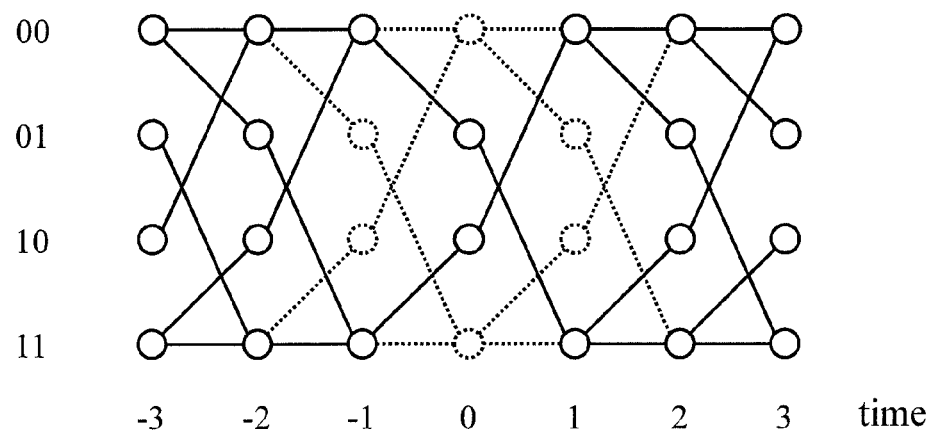
FIG. 11 is a trellis diagram showing a decoding process using PRML method.

FIG. 11 is a trellis diagram showing a decoding process using PRML method. For the sake of simplification, an example is shown where the constraint length is 3 and the minimum run-length is 1. FIG. 11 shows a branch metric around the fixed connection word shown in FIG. 10. The values below the trellis diagram are times based on the appearance time (=0) of the fixed connection word as the reference time. The states represented by dotted lines are states that are not required to be considered in decode process because the pattern has already been determined by the fixed connection word. In other words, these patterns may be handled as invalid. The branches represented by dotted lines are branches that are not required to be considered in decode process because these branches come from or end at invalid states. In other words, these branches may be handled as invalid.

The ACS process is different between when it is concerned with invalid states or branches and when not. As in the state "00" of time 1, if a state is valid but one of branches extended from the preceding time (time 0) is invalid, the another valid branch is selected. Thus the path memory 74 (described in FIG. 12 later) stores the state that will be a start point of valid branch. The branch metric calculated for valid branches can be added to the path metric of preceding times to generate a new path metric. As in the state "00" of time 0, if the state is invalid, the path memory 74 stores a value indicating an invalid state. Accordingly, if path merge is performed using trace back scheme, trace back will not be performed for paths where a value indicating invalid state is set at the beginning of trace back.

It is required to perform the above-described procedure after accurately recognizing locations of fixed connection words. In other words, it is necessary to notify the ACS unit in the PRML decoder of the timing when the fixed connection words appear. A configuration of the PRML decoder implementing such function will be described below.

Figure 12:
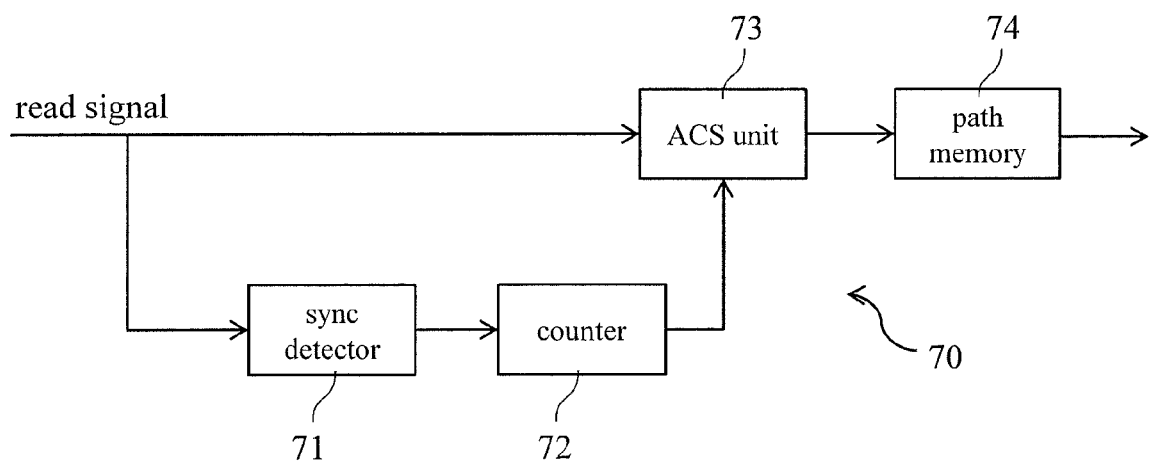
FIG. 12 is a block diagram of a PRML decoder 70 according to an embodiment 2.

FIG. 12 is a block diagram of a PRML decoder 70 according to the embodiment 2. The PRML decoder 70 comprises a sync detector 71, a counter 72, an ACS unit 73, and the path memory 74.

The signals reproduced by the PRML decoder 70 are inputted into the ACS unit 73 and into the sync detector 71 simultaneously. The sync detector 71 detects the beginning of frame using the frame sync unit 60 described in FIG. 10. Since the channel word length is constant in fixed length modulation, the fixed connection word appears at a constant time interval. Thus the ACS unit 73 may be controlled as above at the constant time interval after detecting the beginning of frame. After the sync detector 71 detects the beginning of frame, the counter 72 counts the channel clock from that time point, and notifies to the ACS unit 73 the timing to change the behavior of the ACS unit 73. The ACS unit 73 changes the ACS behavior during a required duration (in the example of FIG. 11, from time −1 to time 2) according to the notification. The processing result of the ACS unit 73 is stored in the path memory 74.

Figure 13:
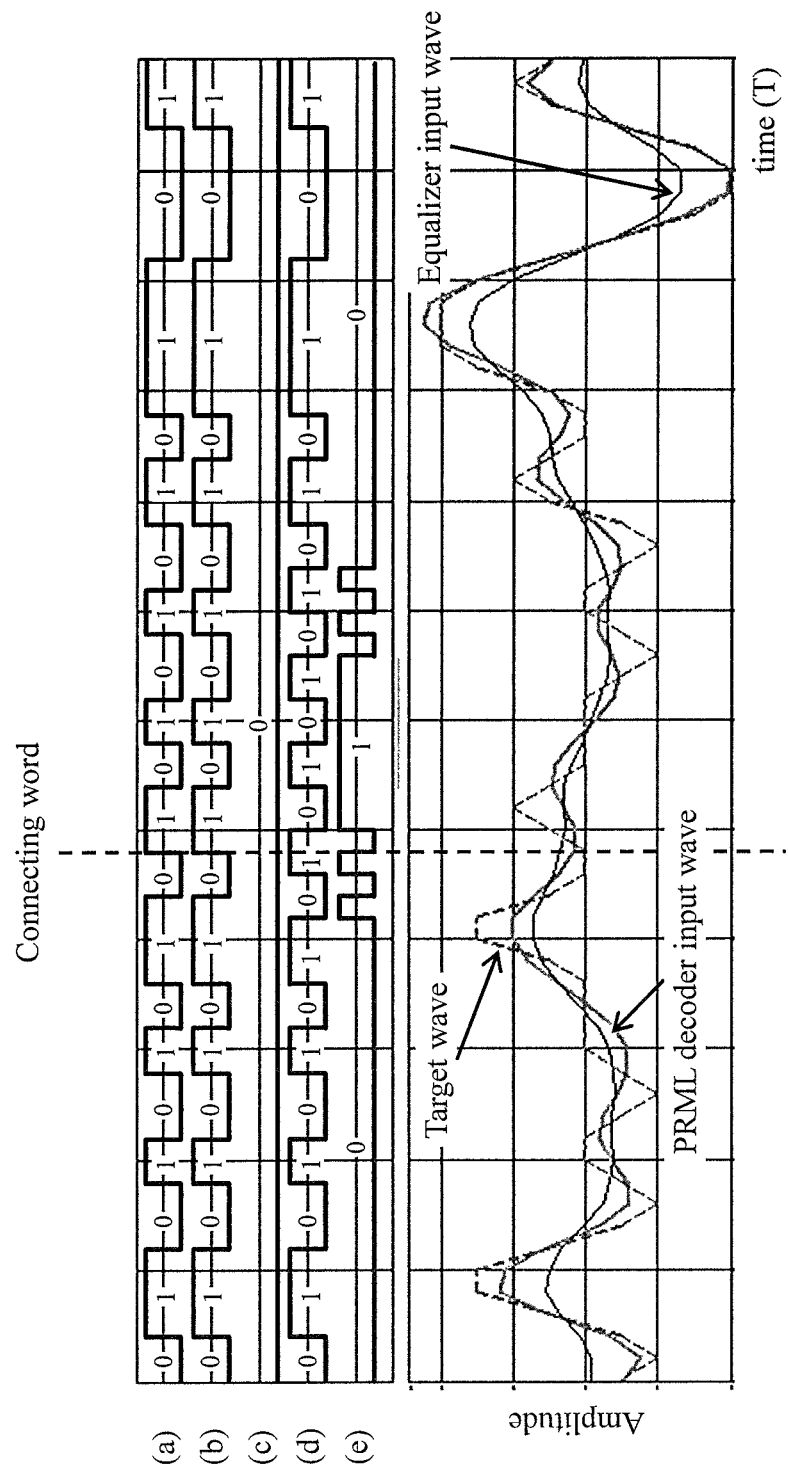
FIG. 13 shows a simulation result of an example in which an error propagation at a channel bit word boundary is prohibited.

FIG. 13 shows a simulation result of an example in which an error propagation at a channel bit word boundary is prohibited. The calculation conditions of optical responses are: spot light wavelength=405 nm; objective lens NA=0.85. Reproduction signals are calculated using convolution with respect to channel bit patterns based on optical responses calculated by optical simulations (channel bit length: 48 nm). Channel bit patterns are generated by performing, with respect to random user data sequence, fixed length modulation with the minimum run length of 1 having the above-mentioned regularity. This modulation corresponds to (1, 7;10, 18;1) RLL according to conventional expressions. Therefore, a fixed connection word is inserted for each of 18 channel bits. The PR class used for decoding is PR (1, 2, 2, 2, 1) ML. One grid of the horizontal axis in FIG. 12 corresponds to 5 channel bits or channel clocks.

The lower half of FIG. 13 shows an input waveform into an equalizer, an input waveform into a decoder, and a target waveform. The upper half of FIG. 13 shows following binary signals. (a) original channel bit pattern (NRZI format); (b) decoded result of input waveform by the PRML decoder 70 according to the embodiment 2; (c) comparing result between (a) and (b) ("1" corresponds to error); (d) decoded result using conventional PRML method; (e) comparing result between (a) and (d) ("1" corresponds to error). The vertical dotted line shows the location of the fixed connection word.

With reference to FIG. 13(e), it is understood that burst error occurs sandwiching the channel bit word boundary if decoding is performed using conventional PRML method. This is because combination patterns that are likely to cause burst errors exist around the channel bit word boundary. On the other hand, as can be seen from FIG. 13(c), the decoding result using the PRML decoder 70 according to the embodiment 2 does not include errors. The error at the position away from the fixed connection word by 12T is also resolved.

Figure 14:
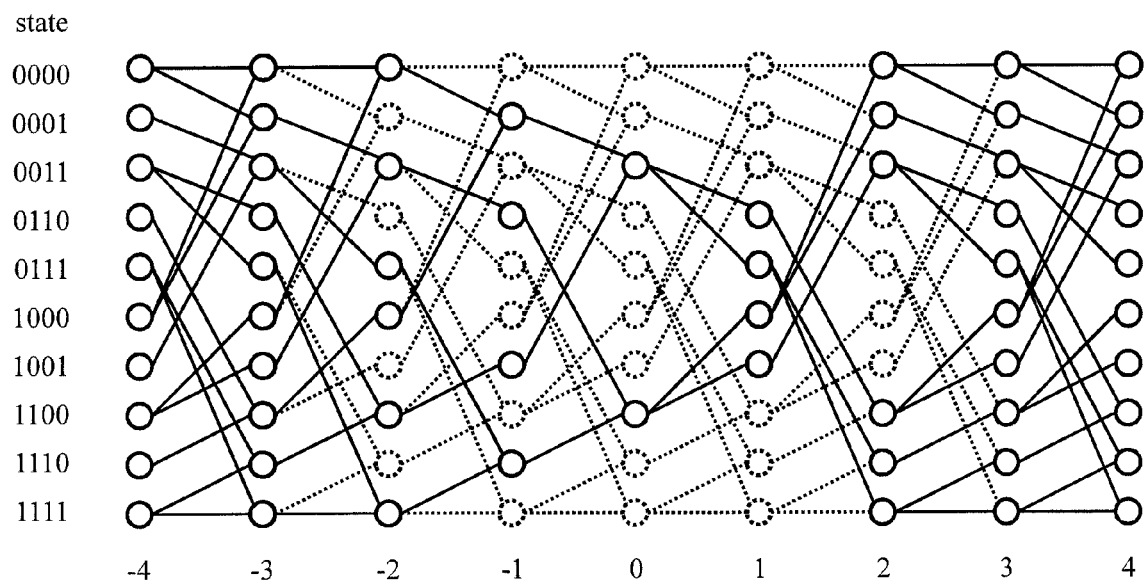
FIG. 14 shows a trellis diagram of the PRML decoder 70 around a fixed connection word when a constraint length is 5 and a minimum run-length is 1.

FIG. 14 shows a trellis diagram of the PRML decoder 70 around a fixed connection word when a constraint length is 5 and a minimum run-length is 1 (i.e. corresponding to the example of FIG. 13). The notation follows that of FIG. 11. In this case, it is understood that the behavior of the ACS unit 73 is required to be controlled for 6 time units from time −2 to time 3. The length of ACS unit control range M by which the behavior of the ACS unit 73 is required to be controlled is given by Equation 5 assuming that the constraint length is L.

$$M=2d+L-1 \qquad \text{(Equation 5)}$$

In the above-described examples, the behavior of the ACS unit 73 is controlled for each of time within all ranges influenced by the fixed connection word decided by the minimum run length and the constraint length. In order to achieve it, it is necessary to provide a function to change the behavior for all of states and branches in the ACS unit 73. However, that incurs complication of circuit and control. Thus in the case of FIG. 14, for example, it is contemplated to control the behavior of ACS from time 2 to time 3 only. Though the change lasts only for one time unit, all paths pass through the state corresponding to the fixed connection word at time 0 by limiting the behavior of the ACS unit 73 for that duration. The same result was acquired by decoding the same signal as that of FIG. 13 under such conditions. However, the equivalent result is not always acquired. In comparison for the decoding results of channel bit signals with length of $10^6$, if the state is controlled only for one time unit around the fixed edge, the channel bit error rate slightly degrades from $9.01 \times 10^{-4}$ to $9.62 \times 10^{-4}$. On the other hand, it is advantageous in that the configuration of the ACS unit 73 can be significantly simplified.

Figure 15:
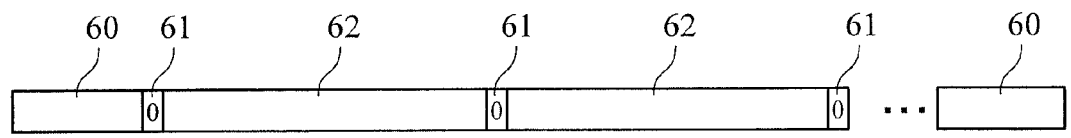
FIG. 15 is a diagram showing a frame configuration example using another connection word.

FIG. 15 is a diagram showing a frame configuration example using another connection word. Assuming decode process using PRML method, it is not necessary to use specific bit patterns as connection words. Thus in FIG. 15, the zero unit 61, i.e. "0" with a length equal to that of the minimum run length, is used as a connection word. The channel word 62 is generated from user data using the above-described method. Since the zero unit 61 is used as the connection word, there are at least d bits of consecutive "0". In other words, the pattern is constrained for d time units.

If the zero unit 61 is used as the connection word, the length required for connecting channel words is substantially decreased than the case using fixed connection word. Therefore, especially when the minimum run length is large, the effective efficiency E* of modulation code can be more easily improved. However, in order to satisfy the maximum run length limitation, the limitation for consecutive "0" at both ends of channel word is stricter.

Figure 16:
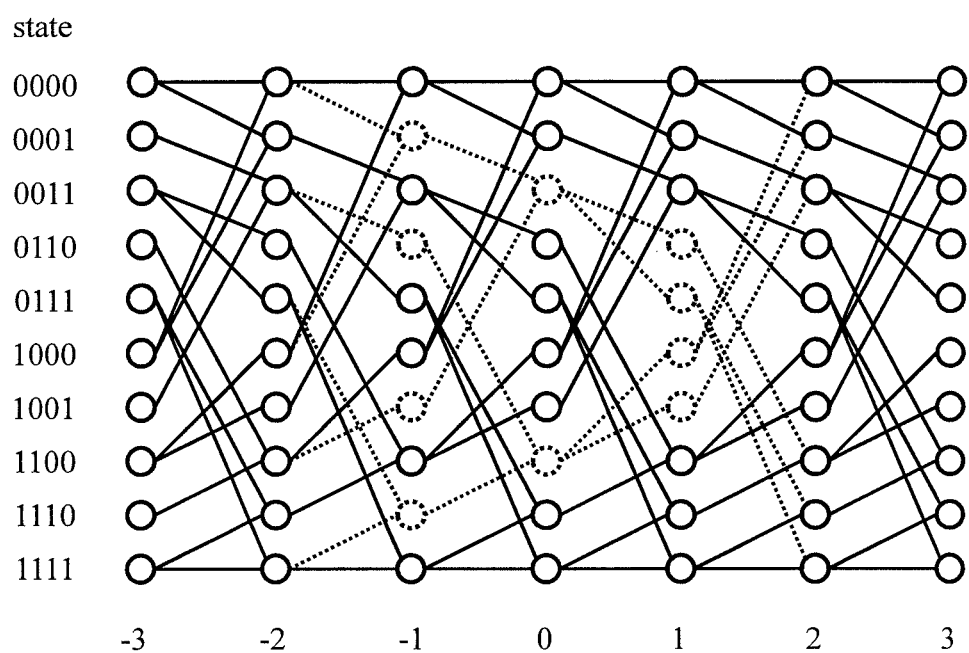
FIG. 16 shows a trellis diagram of the PRML decoder 70 when a constraint length is 5, a minimum run-length is 1, and a connection word is a zero unit 61.

FIG. 16 shows a trellis diagram of the PRML decoder 70 when a constraint length is 5, a minimum run-length is 1, and a connection word is the zero unit 61. The notation follows that of FIG. 11. However, the time 0 is set when the zero unit ("00" or "11" in NRZI notation) is at the center of the state patterns. In this case, it is understood that the behavior of the ACS unit 73 is required to be controlled for four time units from time −1 to time 2. The length of ACS unit control range M by which the behavior of the ACS unit 73 is required to be controlled is given by Equation 6 assuming that the constraint length is L.

$$M=d+L-2 \qquad \text{(Equation 6)}$$

Figure 17:
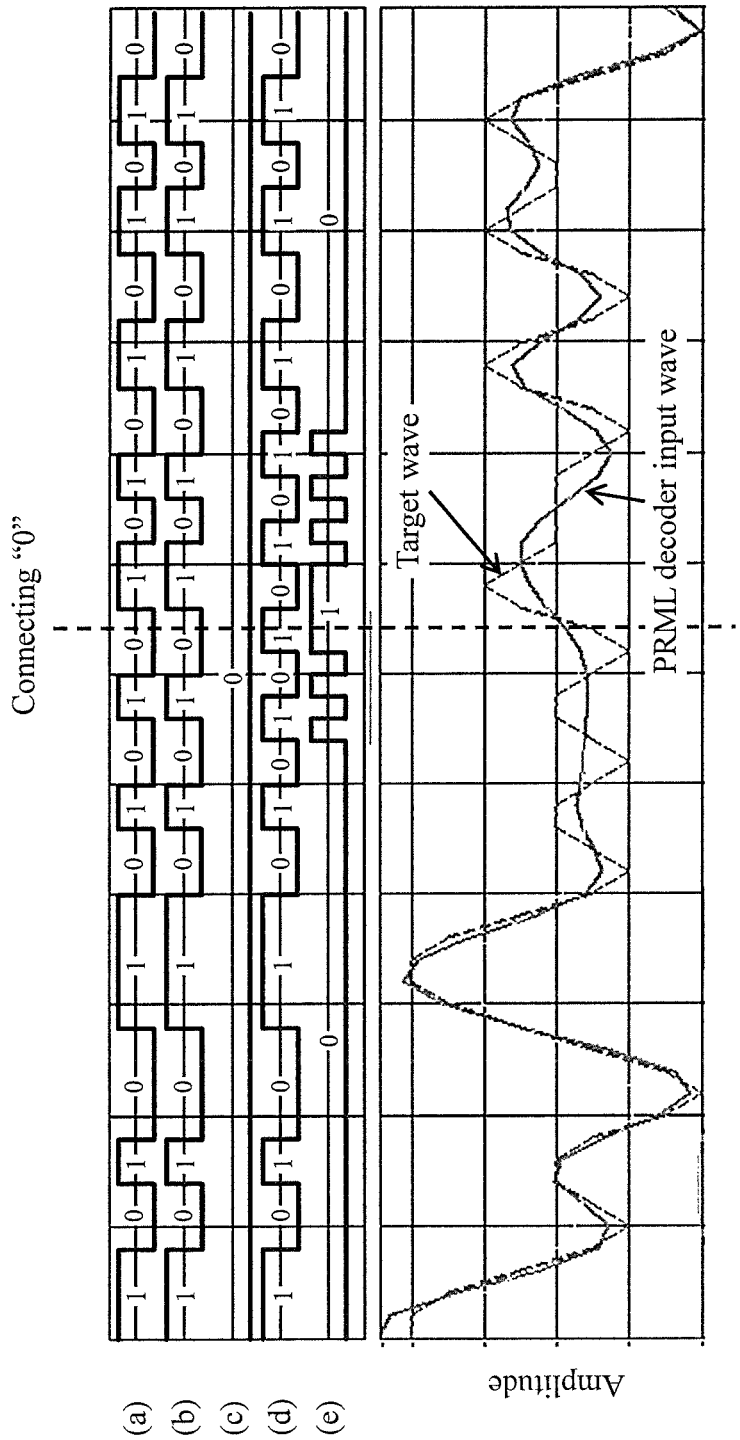
FIG. 17 shows a simulation result of an example in which an error propagation at a channel bit word boundary is prohibited.

FIG. 17 shows a simulation result of an example in which an error propagation at a channel bit word boundary is prohibited. Calculation conditions and the like are the same as those of FIG. 13. This modulation corresponds to (1, 11;10, 16;1) RLL according to conventional expressions. Therefore, a connection word of "0" is inserted for each of 16 channel bits.

The lower half of FIG. 17 shows an input waveform into a decoder and a target waveform. The upper half of FIG. 17 shows following binary signals. (a) original channel bit pattern (NRZI format); (b) decoded result of input waveform by the PRML decoder 70 according to the embodiment 2; (c) comparing result between (a) and (b) ("1" corresponds to error); (d) decoded result using conventional PRML method; (e) comparing result between (a) and (d) ("1" corresponds to error). The vertical dotted line shows the location of the connection word.

With reference to FIG. 17(e), it is understood that burst error occurs sandwiching the channel bit word boundary if decoding is performed using conventional PRML method. This is because combination patterns that are likely to cause burst errors exist around the channel bit word boundary. On the other hand, as can be seen from FIG. 17(c), the decoding result using the PRML decoder 70 according to the embodiment 2 does not include errors. In this way, even if using the zero unit 61 as connection words, an effect approximately equivalent to that of the case using fixed connection words can be obtained.

When using the zero unit 61 as connection words, the behavior of the ACS unit 73 may be controlled only for a part of durations (e.g. from time 1 to time 2 in FIG. 16) as in the case of using fixed connection words.

<Embodiment 2: Summary>

As discussed thus far, the PRML decoder 70 according to the embodiment 2 uses a fixed bit sequence as a connection word between channel bit words. Accordingly, it is possible to suppress influences of burst errors propagating into adjacent channel bit words even if fixed length code is used.

In addition, at the time when fixed connection words appear, the PRML decoder 70 according to the embodiment 2 invalidates the state and branch in the trellis diagram in the ACS unit 73 to suspend the path metric calculation, and uses the states and branches derived from the fixed connection word. This enables effectively performing decode process utilizing the fixed connection word.

<Embodiment 3>

Figure 18:
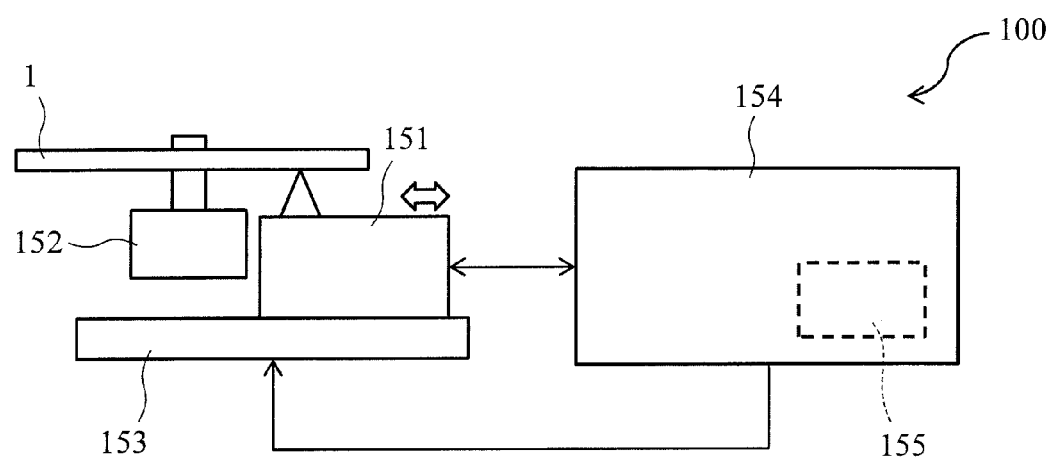
FIG. 18 is a configuration diagram of an optical disc device 100 according to an embodiment 3.

FIG. 18 is a configuration diagram of an optical disc device 100 according to an embodiment 3 of the present invention. The optical disc 1 is rotated by a spindle motor 152. An optical pickup 151 is configured by a light source used for recording and reproducing, an optical system such as an objective lens, and the like. The optical pickup 151 performs seek operation using a slider 153. A main circuit 154 instructs seek, rotation of the spindle motor, and the like. The main circuit 154 equips each of the circuits performing code modulation and demodulation described in the embodiments 1-2 (the channel bit processor 30, the PRML decoder 70), a decode signal processing circuit, a processing system such as focusing and tracking feedback controller, a microprocessor, a memory, and the like. A firmware 155 controls the overall operation of the optical disc device 100. The firmware 155 is stored in a memory in the main circuit 154. The microprocessor executes it.

DESCRIPTION OF SYMBOLS

30 channel bit word processor
31 adder
32 channel bit word generator
33 offset calculator
34 searcher
35 avoidance list
36 channel bit word demodulator
70 PRML decoder
71 sync detector
72 counter
73 ACS unit
74 path memory
100 optical disc device

What is claimed is:

1. A channel bit word processor that processes a channel bit word using a run-length limit code of fixed length based on enumeration, comprising:
   a channel bit word generator that generates the channel bit word using a user bit word;
   an avoidance list that describes a difference between an identifier of the user bit word that satisfies a maximum run-length limitation in run-length limit code and an identifier of the user bit word that does not satisfy the maximum run-length limitation; and
   an adder that adds the difference described in the avoidance list to the user bit word,
   wherein if the user bit word does not satisfy the maximum run-length limitation, the channel bit word generator generates the channel bit word using the user bit word corresponding to an identifier after the adder adds the difference.

2. The channel bit word processor according to claim 1,
   wherein the avoidance list stores an identification value that specifies one or more of the user bit word to which a same value of the difference is to be applied,
   and wherein the channel bit word generator specifies the difference that is to be applied to the user bit word in accordance with the identification value stored in the avoidance list, and applies the specified difference to the user bit word.

3. The channel bit word processor according to claim 2,
   wherein the identification value is configured by a combination of: a minimum user bit word identification value specifying the user bit word having a minimum identifier among one or more of the user bit word to which a same value of the difference is to be applied; and the difference corresponding to the minimum user bit word identification value,
   and wherein the channel bit word generator specifies the difference that is to be applied to the user bit word by comparing an identifier of the user bit word and the minimum user bit word identification value, and applies the specified difference to the user bit word.

4. The channel bit word processor according to claim 1, further comprising a channel bit word demodulator that demodulates the channel bit word into a user bit word,
   wherein the channel bit word demodulator demodulates a user bit word using the channel bit word after the adder subtracts the difference.

5. An optical information recording and reproducing device comprising the channel bit word processor according to claim 1.

6. An optical information recording and reproducing device comprising the channel bit word processor according to claim 4.

* * * * *